(12) United States Patent
Gill

(10) Patent No.: US 7,199,685 B2
(45) Date of Patent: Apr. 3, 2007

(54) THREE-TERMINAL, TUNABLE ACTIVE INDUCTOR

(75) Inventor: Christopher A. Gill, Orange, CA (US)

(73) Assignee: Agere Systems Inc., Allentown, PA (US)

( * ) Notice: Subject to any disclaimer, the term of this patent is extended or adjusted under 35 U.S.C. 154(b) by 228 days.

(21) Appl. No.: 10/929,843

(22) Filed: Aug. 30, 2004

(65) Prior Publication Data

US 2006/0044099 A1    Mar. 2, 2006

(51) Int. Cl.
*H03H 11/02* (2006.01)

(52) U.S. Cl. ............................ 333/214; 333/215
(58) Field of Classification Search ............. 333/214, 333/215

See application file for complete search history.

(56) References Cited

U.S. PATENT DOCUMENTS

| 5,202,655 | A | * | 4/1993 | Hara ........................ 333/215 |
| 5,256,991 | A | * | 10/1993 | Campbell et al. ........... 333/215 |
| 5,347,238 | A | * | 9/1994 | Kobayashi ............... 331/117 R |
| 5,600,288 | A | * | 2/1997 | Liu ........................... 333/214 |
| 5,726,613 | A | * | 3/1998 | Hayashi et al. ............. 333/214 |
| 6,028,496 | A | * | 2/2000 | Ko et al. ................... 333/214 |
| 6,211,753 | B1 | * | 4/2001 | Leifso et al. ............... 333/214 |
| 6,515,560 | B1 | * | 2/2003 | Adan ........................ 333/214 |
| 6,737,944 | B2 | * | 5/2004 | Kunikiyo .................. 333/214 |
| 7,020,450 | B2 | * | 3/2006 | Desclos ..................... 455/313 |
| 7,042,317 | B2 | * | 5/2006 | Xiao et al. ................. 333/214 |

* cited by examiner

*Primary Examiner*—Robert Pascal
*Assistant Examiner*—Kimberly E Glenn

(57) ABSTRACT

The present invention provides an active inductor apparatus and system, having a variable frequency response through inductance adjustment. The active inductor apparatus comprises a variable resistive element and a variable gain element, and the system further comprises an inductance controller and a gain controller. The variable resistive element has a first terminal and a second terminal, with the second terminal capable of receiving a first adjustment signal. The inductance controller is capable of providing the first adjustment signal to control and adjust a resistance level of the variable resistive element. The variable gain element has a third terminal capable of receiving a second adjustment signal. The gain controller is capable of providing the second adjustment signal to control and adjust a transconductance of the variable gain element. The frequency response of the active inductor apparatus and system is variable in response to adjustment of the resistance level of the variable resistive element and in response to adjustment of the transconductance of the variable gain element.

30 Claims, 3 Drawing Sheets

THREE-TERMINAL, TUNABLE ACTIVE INDUCTOR

FIELD OF THE INVENTION

The present invention relates, in general, to active inductor circuits, and in particular, to a three-terminal, tunable active inductor integrated circuit.

BACKGROUND OF THE INVENTION

Maintaining a minimum bandwidth is often a significant concern in many applications involving integrated circuitry, particularly in high frequency communication systems that utilize limiting amplifiers. The bandwidth of an active inductor-loaded amplifier (or buffer) is generally a function of the total output capacitance and resistance, along with an inductance "L" which, for an active inductor, is in turn a function of a resistance "R", parasitic capacitance, and transconductance of the transistor utilized to implement the active inductor. In the prior art, attempts to provide a predetermined bandwidth have typically consisted of utilizing a selected, fixed resistance value, which is set to tune the active inductor such that a portion of the capacitive load is canceled (and the bandwidth is extended).

Such use of a selected, fixed resistance value is disclosed in Hayashi et al., U.S. Pat. No. 5,726,613, issued Mar. 10, 1998, which provides an active inductor using a common-gate cascode arrangement of field-effect transistors (FETs), and which provides for altering the frequency characteristics of the inductor by selecting a resistance value $R_0$, presumably during integrated circuit (IC) fabrication (Cols. 10–11).

Another active inductor is disclosed in Leifso et al. US. Pat. No. 6,211,753 B1, issued Apr. 3, 2001, which also utilizes a cascode topology incorporating two tuning capacitors (having significantly greater capacitance than the FET parasitic capacitances). Actual tuning, however, was accomplished manually, by breaking air bridges within sub-capacitors comprising the two capacitors (Col. 6).

Process variations in integrated circuit manufacture, temperature variations, and supply variations, however, often significantly affect the resulting resistance, capacitance, and transconductance of an active inductor circuit. As a consequence, the resulting available bandwidth is also subject to wide variations, despite any selection of resistance or capacitance values for fabrication.

A need remains, therefore, for an active inductor circuit which is capable of being tuned continuously to achieve a desired bandwidth, over process, temperature and supply variations. Such an active inductor circuit should provide such capability for real-time and automatic control over the inductance, through use of a third terminal which is couplable to other circuitry for real-time feedback and control. Such a third terminal should also be adjustable open-loop to enhance system performance through use of a digital-to-analog converter, depending upon the desired level of inductance.

SUMMARY OF THE INVENTION

The present invention provides an active inductor apparatus and system, which have a variable frequency response through adjustment of their corresponding inductances. The active inductor apparatus comprises a variable resistive element and a variable gain element, and the system further comprises an inductance controller and a gain controller. The variable resistive element has a first terminal and a second terminal, with the second terminal capable of receiving a first adjustment signal. The variable resistive element may be embodied as a p-channel field effect transistor (pFET), with the first adjustment signal applied at the pFET gate, as a gate-to-source voltage. The inductance controller is capable of providing the first adjustment signal to control and adjust a resistance level of the variable resistive element. The variable gain element has a third terminal capable of receiving a second adjustment signal, and may be embodied as an n-channel field effect transistor (nFET). The gain controller is capable of providing the second adjustment signal to control and adjust a transconductance of the variable gain element, typically provides as a current through the NFET. The frequency response of the active inductor apparatus and system is variable in response to adjustment of the resistance level of the variable resistive element and in response to adjustment of the transconductance of the variable gain element.

The use of pFETs to provide a variable and controlled resistance value, through a third, gate terminal, and the use of nFETs to provide a variable and controlled transconductance, provides improved control over system frequency response. In addition, the apparatus and system of the present invention provides a smaller parasitic capacitance, smaller IC layout, and improved bandwidth, compared to prior art active inductors.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, in which:

Figure (or "FIG.") 1 is a block diagram illustrating an exemplary apparatus embodiment 50 and an exemplary system embodiment 75 in accordance with the present invention.

Figure 1:
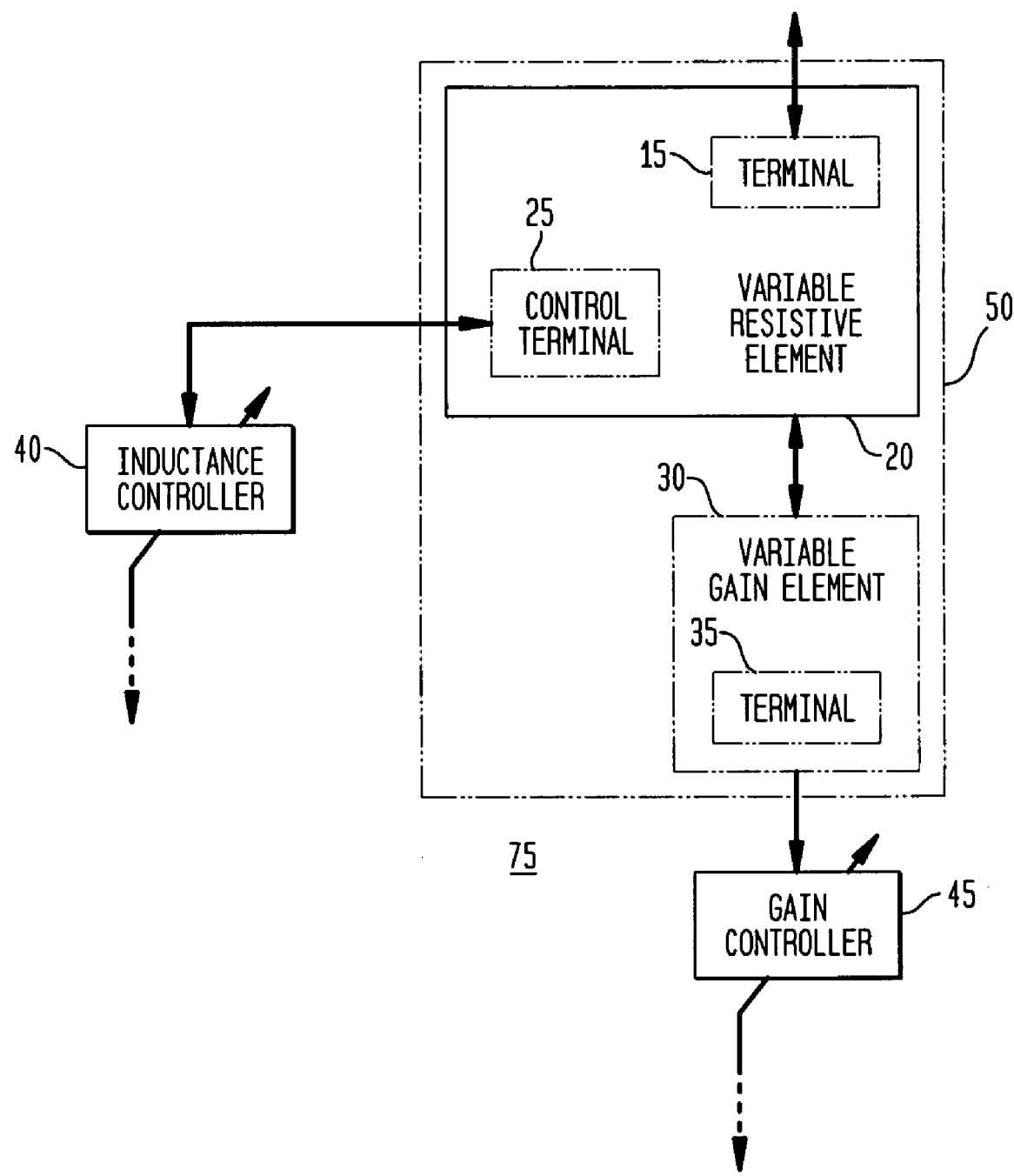

Figure (or "FIG.") 2 is a circuit and block diagram illustrating an exemplary apparatus embodiment 100 and an exemplary system embodiment 200 in accordance with the present invention.

Figure (or "FIG.") 3 is a circuit diagram illustrating a first exemplary inductance controller 300 in accordance with the present invention.

Figure (or "FIG.") 4 is a circuit diagram illustrating a second exemplary inductance controller 400 in accordance with the present invention.

DETAILED DESCRIPTION OF THE EXEMPLARY EMBODIMENTS

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As mentioned above, a need remains for an active inductor circuit which is capable of being tuned to have a desired bandwidth, independently from process, temperature and supply variations during fabrication. Such an active inductor circuit is provided in accordance with the present invention. The active inductor circuit of the present invention further provides capability for real-time and automatic control over the inductance, through use of a third terminal which is couplable to other circuitry for real-time feedback and control. In addition, in selected embodiments, the active inductor circuit of the present invention may also be configured to provide a constant inductance for a predetermined, selected bandwidth, which is also independent of any process, temperature, supply, or other fabrication variations.

Figure (or "FIG.") 1 is a block diagram illustrating a first exemplary apparatus embodiment 50 and a first exemplary system embodiment 75 in accordance with the present invention. Referring to FIG. 1, the first apparatus 50 of the invention comprises a variable resistive element 20 and a variable gain element 30. The first system 75 comprises the variable resistive element 20 and the variable gain element 30, in conjunction with an inductance controller 40 and a gain controller 45.

The variable resistive element 20 has a control terminal 25, as a first terminal of the apparatus 50, which provides for coupling to the inductance controller 40. The inductance controller 40 controls the resistance of the variable resistive element 20, and may receive and be responsive to feedback from other portions of any circuit coupled to the system 75. As illustrated, the variable resistive element 20 also includes a terminal 15, as a second terminal of the apparatus 50, for coupling to other portions of any circuit which includes the system 75.

The variable gain element 30 also includes a terminal 35, as a third terminal of the apparatus 50, which provides for coupling to the gain controller 45 and also for coupling to other portions of any circuit which includes the system 75. The gain controller 45 controls the gain of the variable gain element 30, and may receive and be responsive to feedback from other portions of any circuit coupled to the system 75.

In the apparatus 50, inductance "L" has a linear relationship to the resistance (or, equivalently, impedance) R of the variable resistive element 20 and any parasitic capacitance "C", and an inverse (linear) relationship to a transconductance "$g_m$" of the variable gain element 30. This relationship may be expressed, for example, as $L=mR(C/g_m)$, where "m" may be a constant. In accordance with the present invention, the inductance of the apparatus 50 is controlled by varying the resistance (R) and transconductance ($g_m$), through the inductance controller 40 and gain controller 45, respectively, to achieve a selected or desired inductance and corresponding frequency response or bandwidth. As indicated above, this control may be implemented using any suitable feedback arrangement from any other coupled circuitry to the inductance controller 40 and/or the gain controller 45.

Figure 2:
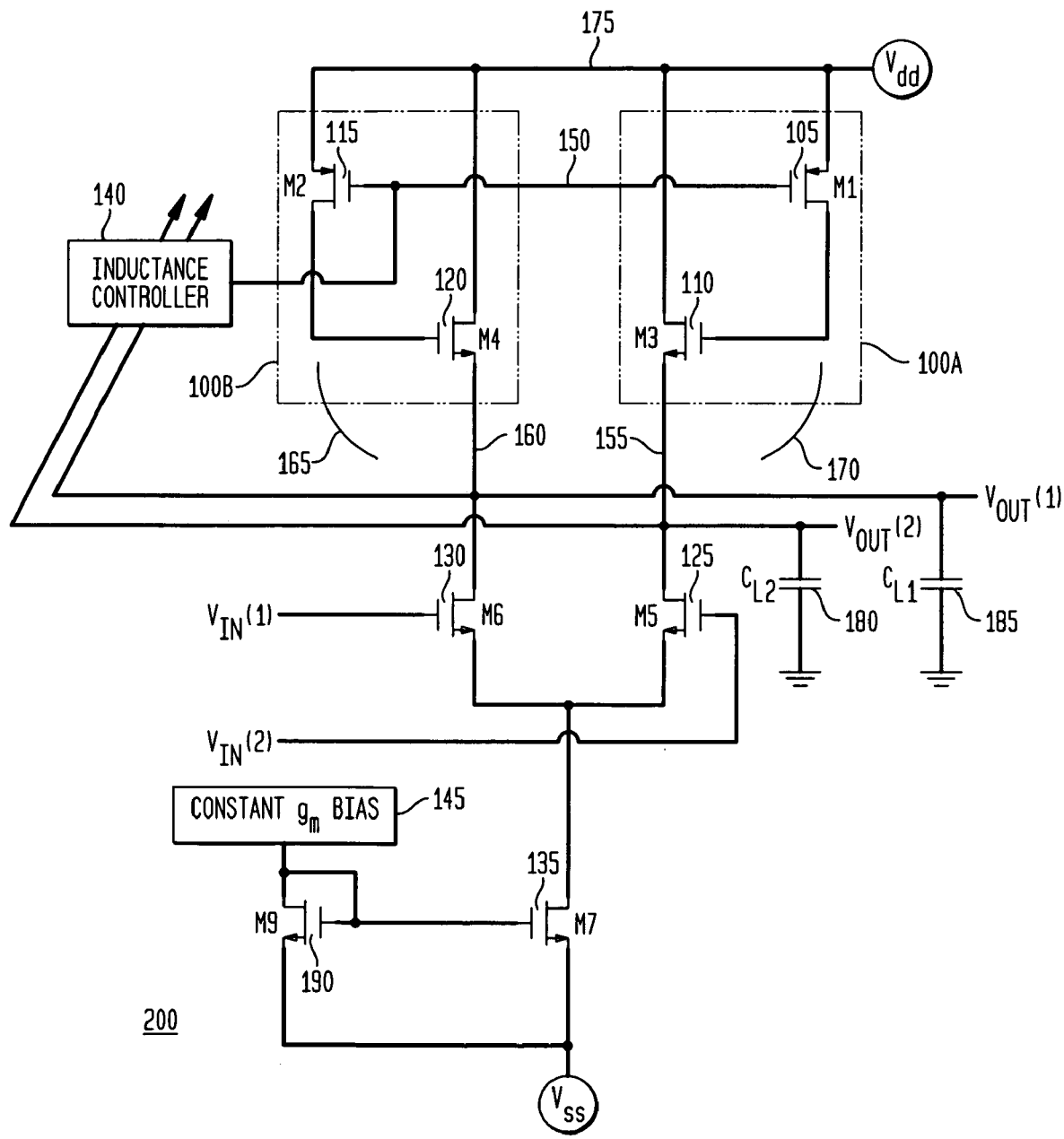

Figure 2 (or "FIG. 2") is a block diagram illustrating a second exemplary apparatus embodiment 100 and a second exemplary system embodiment 200 in accordance with the present invention. In FIG. 2, two structurally identical apparatuses 100A and 100B are illustrated, each being utilized with a corresponding portion of a differential amplifier stage (transistors M5 (125) and M6 (130)) comprising the system 200, and are individually and collectively referred to as an apparatus 100. Each apparatus 100 comprises a p-channel FET (pFET), as a controllable and variable resistive element (such as a variable resistive element 20), coupled to an n-channel FET (nFET), as a controllable and variable gain element (such as variable gain element 30). More specifically, for apparatus 100A, a pFET M1 (105) has a source coupled to a voltage supply (or voltage supply bus) Vdd, a drain coupled to a gate of an nFET M3 (110), and a gate coupled (through node 150) to an inductance controller 140 (and the gate of M2 (115)). An inductance control voltage is provided on node 150. The nFET M3 (110) has a drain coupled to a voltage supply (or voltage supply bus) Vdd, a gate coupled to the drain of the pFET M1 (105), and a source coupled (through node 155) to the remainder of the system 200 which, in this case, is the drain of the differential amplifier transistor M5 (125) (which also provides one of the differential output voltages, Vout(2)). In addition, it should be noted that NFET M3 has a gate-to-source (170) parasitic capacitance (referred to herein as "$Cgs_{(a)}$"), and a transconductance $g_{m(a)}$. Not separately illustrated in FIG. 2, each of the various transistors has a corresponding substrate connection, such as to Vdd or to Vss (typically ground).

As illustrated, apparatus 100B is structurally identical to apparatus 100A, providing a corresponding active inductor for the transistor M6 (130) of the differential amplifier. More specifically, for apparatus 100B, a pFET M2 (115) has a source coupled to the voltage supply (or voltage supply bus) Vdd, a drain coupled to a gate of an nFET M4 (120), and a gate coupled (through node 150) to the inductance controller 140 (and the gate of M1 (105)). The nFET M4 (120) has a drain coupled to a voltage supply (or voltage supply bus) Vdd, a gate coupled to the drain of the pFET M2 (115), and a source coupled (through node 155) to the remainder of the system 200 which, in this case, is the drain of the differential amplifier transistor M6 (130) (which also provides the second of the differential output voltages, Vout(1)). In addition, it should be noted that nFET M4 has a gate-to-source (165) parasitic capacitance (referred to herein as "$Cgs_{(b)}$"), and a transconductance $g_{m(b)}$.

In the embodiment illustrated, each pFET (105 or 115) provides a control terminal, node 150, as a one of the three terminals of the inductor (with the other two terminals being node 175 and either node 155 or 160 (for respective apparatuses 100A and 100B)). Through such a control terminal, the resistance of the pFET may be adjusted to correspondingly vary the inductance of the apparatus 100. More specifically, and as mentioned above for the first apparatus 50, for each second apparatus 100A or 100B, the inductance "L" of the apparatus 100 has a linear relationship to the resistance (or, equivalently, impedance) R of the pFET (M1 (105) or M2 (115)), the parasitic gate-to-source capacitance Cgs of the corresponding nFET (M3 (110) or M4 (120)), and an inverse (linear) relationship to the transconductance $g_m$ of the corresponding nFET (M3 (110) or M4 (120)). This relationship may be expressed, for example, as $L=kR(Cgs/g_m)$, where "k" may be a constant. The resistance (or impedance) R of the pFET (M1 (105) or M2 (115)) may be varied as a function of the corresponding gate-to-source voltage (Vgs) of the pFET, and controlled through the third (control) terminal (at node 150) using the inductance controller 140, with resistance decreasing with greater Vgs (i.e., gate voltage being lower for a positive Vdd).

The inductance controller 140, as indicated above, provides control over the impedance or resistance of pFETs (M1 (105) or M2 (115)) by controlling their corresponding gate voltages (biases) at node 150, to provide the desired or selected frequency response. As illustrated in the second system 200, the inductance controller 140 may receive feedback from the corresponding output voltages at output terminals Vout(1) (across capacitor 180) and Vout(2) (across capacitor 185, where capacitors 180 and 185 represent loads of other coupled circuitry), or from elsewhere in any other coupled circuitry, utilizing any known feedback or control methodology. A first exemplary inductance controller 140

(or exemplary inductance controller 40), utilized for providing a variable inductance, is illustrated below with reference to FIG. 3, as inductance controller 300. A second exemplary inductance controller 140 (or exemplary inductance controller 40), also utilized for providing a variable inductance, is illustrated below with reference to FIG. 4, as inductance controller 400.

The bandwidth (or frequency response) of the system 200 is also a function of the transconductance ($g_m$) (or gain) of the corresponding nFETs (M3 and M4) and the total capacitance (as seen from the output terminals Vout(1) and Vout (2)). As discussed in greater detail below, these may also be varied (or kept constant) to provide a selected or desired frequency response (generally in conjunction with the operation of the inductance controller 40 or 140). As illustrated in FIG. 2, as an exemplary gain controller 45, $g_m$ bias generator 145 is utilized with a diode-connected nFET M9 (190) to provide a bias voltage to a gate of nFET M7 (135), thereby controlling the level of drain-to-source current through M7 and providing for a desired or selected $g_m$ of the series-coupled nFETs (M3, MS and M4, M6), such as a constant $g_m$. A gain controller 45 or $g_m$ bias generator 145, utilized for providing a constant $g_m$ or variable $g_m$, may be implemented as known in the art.

While illustrated using two three-terminal, tunable inductors (100A and 100B) with a differential amplifier, a system of the present invention may implement any desired or selected functionality. In addition, such a system may utilize any desired or selected number of three-terminal, tunable inductors 100. For example, in many instances, only one three-terminal tunable inductors 100 may be needed. Conversely, also for example, the illustrated differential amplifier of system 200 may be coupled to other differential amplifier stages, each of which having additional pairs of three-terminal, tunable inductors 100.

Figure 3:
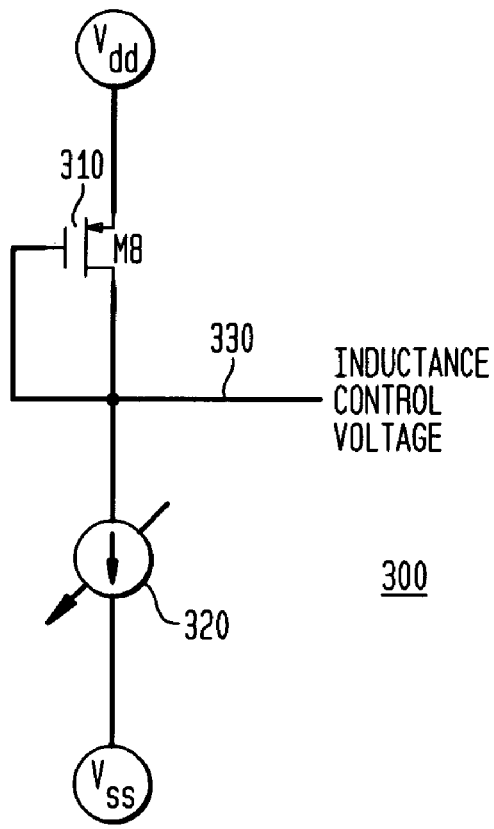

Figure (or "FIG.") 3 is a circuit diagram illustrating an exemplary inductance controller 300 in accordance with the present invention. As indicated above, the exemplary inductance controller 300 is utilized to provide a variable inductance of the apparatus 100, by controlling the resistance (or impedance) of pFETs M1 (105) and M2 (115) via their gates (at node 150), without a separate feedback arrangement. As illustrated in FIG. 3, inductance controller 300 utilizes a diode-connected pFET M8 (310) in series with a variable current source 320. Current source 320 may also be implemented as a digital-to-analog converter, with a digital input utilized to vary the current through current source 320. Varying the current through current source 320 varies the inductance control voltage provided to node 150, to vary the bandwidth. The source of the diode-connected pFET M8 (310) is coupled or couplable to the power supply or power rail (Vdd), thereby providing a voltage difference at output 330 of one Vgs, that is, one gate-to-source voltage of a pFET, as the inductance control voltage. This $Vgs_{(M8)}$ then provides a bias voltage of one Vgs (pFET) to each of the pFETs M1 (105) and M2 (115), which each have their corresponding sources at a voltage level of Vdd, thereby controlling the corresponding resistances of M1 (105) and M2 (115) and, consequently, the inductance of apparatus 100.

Figure 4:
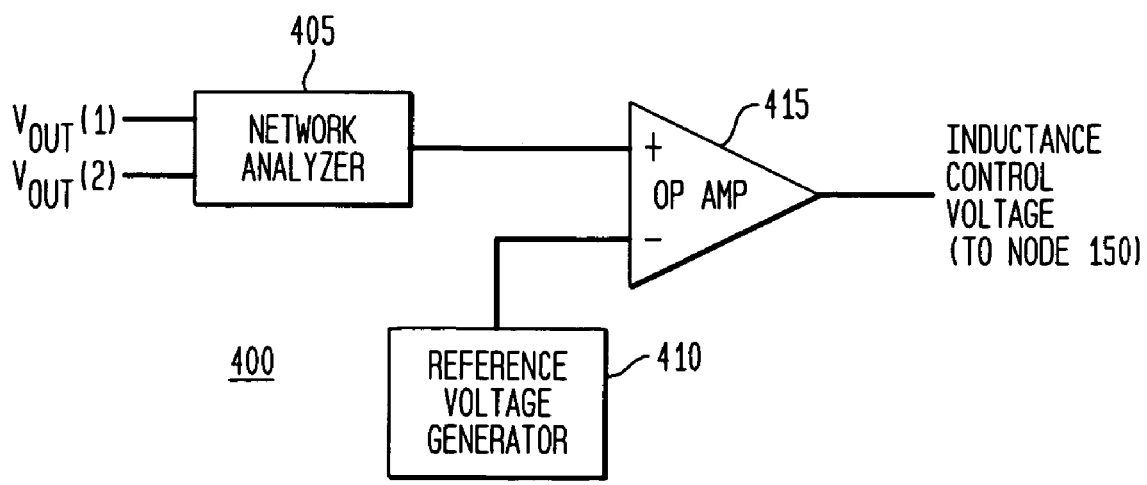

Figure (or "FIG.") 4 is a block diagram illustrating an exemplary inductance controller 400 in accordance with the present invention. As indicated above, the exemplary inductance controller 400 is utilized to provide a variable inductance of the apparatus 100, by controlling the resistance (or impedance) of pFETs M1 (105) and M2 (115) via their gates (at node 150), through providing an inductance control voltage. Referring to FIG. 4, the inductance controller 400 includes a network analyzer 405, a reference circuit 410, and an operational amplifier (op amp) 415. The output of op amp 415 provides the inductance control voltage at node 150. The network analyzer 405 generates an output voltage which represents the 3 dB frequency (3 db voltage). The inputs into network analyzer 405 are Vout(1) and Vout(2) (from nodes 160 and 155). (Alternatively, system 200 may be duplicated as a "dummy circuit", with the inputs provided from corresponding duplicate nodes, and with the inductance control voltage fed back to corresponding nodes of the such a duplicate system 200.) Reference circuit 410 provides a reference voltage. The output of op amp 415 is fed back to node 150 as an inductance control voltage, and with such feedback, will tend to force the 3 dB voltage to be the same as the reference voltage, thereby adjusting the frequency response of the system 200 through control of the three-terminal active inductors to provide a constant bandwidth.

It should be noted that there are innumerable potential inductance controllers (40 or 140) and gain controllers 45 (or gain controllers implemented as bias generators 145), with or without feedback, and any and all of which are within the scope of the present invention.

In summary, the present invention provides an active inductor, the active inductor having three-terminals (15, 25, 35), and the active inductor having a variable frequency response corresponding to a variable inductance of the active inductor. The active inductor comprises, first, a variable resistive element (20) having a first terminal (15) and a second terminal (25), the second terminal (25) capable of receiving a first adjustment signal for control of a resistance level of the variable resistive element; and second, a variable gain element (30) coupled to the variable resistive element, the variable gain element having a third terminal (35), the third terminal capable of receiving a second adjustment signal for control of a transconductance of the variable gain element.

In a selected embodiment, the variable resistive element is embodied as a p-channel field effect transistor (105, 115), and the resistance level of the p-channel field effect transistor (105, 115) is variable through an adjustment of the gate-to-source voltage of the p-channel field effect transistor, on node 150. In the selected embodiment, the variable gain element is embodied as an n-channel field effect transistor (110, 120), and the transconductance of the n-channel field effect transistor (110, 120) is variable through an adjustment of the current of the n-channel field effect transistor.

The active inductor may also include an inductance controller (40, 140) coupled to the second terminal of the variable resistive element (25, (105, 115 at node 150) ), with the inductance controller (40, 140) capable of providing the first adjustment signal to control and adjust the resistance level of the variable resistive element. The inductance controller (40, 140) is capable of receiving a first feedback signal and, in response to the first feedback signal, varying or maintaining the first adjustment signal to control and adjust the resistance level of the variable resistive element. Alternatively, the inductance controller is capable of providing the first adjustment signal to maintain a constant resistance level of the variable resistive element, with or without a feedback signal. When the inductance controller (40, 140) is embodied (300) as a p-channel field effect transistor (310) in series with a current source (320, the first adjustment signal is a gate-to-source voltage of the p-channel field effect transistor (310), provided on node 150 to the variable resistive element (105, 115).

The active inductor may also include a gain controller (45, 145) coupled to the third terminal (35, (155, 160)) of the variable gain element (30, (110, 120)), the gain controller capable of providing the second adjustment signal to control and adjust the transconductance of the variable gain element. In various embodiments, the coupling of the gain controller (45, 145) to the third terminal (35, (155, 160)) of the variable gain element (30, (110, 120)) may be through other circuit elements, such as a differential amplifier (125, 130) and a current source (M7 nFET, 135). The gain controller (45, 145) also may be capable of receiving a second feedback signal and, in response to the second feedback signal, varying or maintaining the second adjustment signal to control and adjust the transconductance of the variable gain element. Alternatively, the gain controller (45, 145) may be capable of providing the second adjustment signal to maintain a constant transconductance of the variable gain element with or without a feedback signal, such as by adjusting a current level of a current source (135), the current level being the second adjustment signal.

Also in summary, the present invention provides active inductor system (75, 200), in which the active inductor system has a variable frequency response. The active inductor. system (75, 200) comprises a first p-channel field effect transistor, an inductance controller, a first n-channel field effect transistor, and a gain controller. The first p-channel field effect transistor (105, 115) having a source, gate and drain, the first p-channel field effect transistor source couplable to a power supply (Vdd, node 175), the first p-channel field effect transistor gate capable of receiving a first adjustment signal (at node 150). The inductance controller (40, 140) is coupled to the first p-channel field effect transistor gate (at node 150), and is capable of providing the first adjustment signal as a gate-to-source voltage of the first p-channel field effect transistor (105, 115) to control and adjust a resistance level of the first p-channel field effect transistor. The first n-channel field effect transistor (110, 120) has a gate, source and drain, with the first n-channel field effect transistor gate coupled to the first p-channel field effect transistor drain (105, 115), the first n-channel field effect transistor drain couplable to the power supply, and with the first n-channel field effect transistor source capable of receiving a second adjustment signal. The gain controller (45, 145) is coupled (typically through other circuit elements) to the first n-channel field effect transistor source (110, 120), with the gain controller capable of providing the second adjustment signal as a current of the first n-channel field effect transistor (110, 120) to control and adjust a transconductance of the first n-channel field effect transistor. In this system embodiment, the frequency response is variable in response to adjustment of the resistance level of the first p-channel field effect transistor and in response to adjustment of the transconductance of the first n-channel field effect transistor.

Also in this system embodiment, the inductance controller may be embodied (300) as a second p-channel field effect transistor (310) in series with a current source (320), and wherein the first adjustment signal is a gate-to-source voltage of the second p-channel field effect transistor (output on line 330 to node 150). The inductance controller may also be embodied as a network analyzer, a reference voltage generator, and an operational amplifier.

Numerous advantages of the present invention may be readily apparent. The use of pFETs to provide a variable and controlled resistance value, through a third, gate terminal, and the use of nFETs to provide a variable and controlled transconductance, provides improved control over system frequency response. In addition, the apparatus and system of the present invention provides a smaller parasitic capacitance, smaller IC layout, and improved bandwidth, compared to prior art active inductors.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An active inductor, the active inductor having three terminals, the active inductor having a variable frequency response corresponding to a variable inductance of the active inductor, the active inductor comprising:
   a variable resistive element having a first terminal and a second terminal, the second terminal capable of receiving a first adjustment signal for control of a resistance level of the variable resistance element, wherein the inductance of the active inductor is variable through an adjustment of the resistance level of the variable resistive element; and
   a variable gain element coupled to the variable resistive element, the variable gain element having a third terminal, the third terminal capable of receiving a second adjustment signal for control of a transconductance of the variable gain element.

2. The active inductor of claim 1, wherein the variable resistive element is embodied as a p-channel field effect transistor, and wherein the resistance level of the p-channel field effect transistor is variable through an adjustment of the gate-to-source voltage of the p-channel field effect transistor.

3. The active inductor of claim 1, wherein the inductance of the active inductor is variable through an adjustment of the transconductance of the variable gain element.

4. The active inductor of claim 3, wherein the variable gain element is embodied as an n-channel field effect transistor, and wherein the transconductance of the n-channel field effect transistor is variable through an adjustment of the current of the n-channel field effect transistor.

5. The active inductor of claim 1, further composing:
   an inductance controller coupled to the second terminal of the variable resistive element, the inductance controller capable of providing the first adjustment signal to control and adjust the resistance level of the variable resistive element.

6. The active inductor of claim 5, wherein the inductance controller is capable of receiving a first feedback signal and, in response to the first feedback signal, varying or maintaining the first adjustment signal to control and adjust the resistance level of the variable resistive element.

7. The active inductor of claim 5, wherein the inductance controller is capable of providing the first adjustment signal to maintain a constant resistance level of the variable resistive element.

8. The active inductor of claim 5, wherein the inductance controller is embodied as a p-channel field effect transistor in series with a current source.

9. The active inductor of claim 8, wherein the first adjustment signal is a gate-to-source voltage of the p-channel field effect transistor.

10. The active inductor of claim 5, wherein the inductance controller comprises:
    a network analyzer adapted to provide a 3 dB voltage signal;

a reference voltage generator; and an operational amplifier coupled the network analyzer and the reference voltage generator, the operational amplifier adapted to provide an inductance control voltage as the first adjustment signal.

11. The active inductor of claim 1, further comprising:

a gain controller coupled to the third terminal of the variable gain element, the gain controller capable of providing the second adjustment signal to control and adjust the transconductance of the variable gain element.

12. The active inductor of claim 11, wherein the grain controller is capable of receiving a second feedback signal and, in response to the second feedback signal, varying or maintaining the second adjustment signal to control and adjust the transconductance of the variable gain element.

13. The active inductor of claim 11, wherein the gain controller is capable of providing the second adjustment signal to maintain a constant transconductance of the variable gain element.

14. An active inductor system, the active inductor system having a variable frequency response, the active inductor system comprising:

a variable resistive element having a first terminal and a second terminal, the second terminal capable of receiving a first adjustment signal;

an inductance controller coupled to the second terminal of the variable resistive element, the inductance controller capable of providing the first adjustment signal to control and adjust a resistance level of the variable resistive element, wherein the inductance controller is capable of receiving a first feedback signal and, in response to the first feedback signal, varying or maintaining the first adjustment signal to control and adjust the resistance level of the variable resistive element;

a variable gain element coupled to the variable resistive element, the variable gain element having a third terminal, the third terminal capable of receiving a second adjustment signal; and a gain controller coupled to the third terminal of the variable gain element, the gain controller capable of providing the second adjustment signal to control and adjust a transconductance of the variable gain element;

wherein the frequency response is variable in response to adjustment of the resistance level of the variable resistive element and in response to adjustment of the transconductance of the variable gain element.

15. The active inductor system of claim 14, wherein the variable resistive element is embodied as a p-channel field effect transistor, and wherein the resistance level of the p-channel field effect transistor is variable through an adjustment of the gate-to-source voltage of the p-channel field effect transistor.

16. The active inductor system of claim 14, wherein the variable gain element is embodied as an n-channel field effect transistor, and wherein the transconductance of the n-channel field effect transistor is variable through an adjustment of the current of the n-channel field effect transistor.

17. The active inductor system of claim 14, wherein the inductance controller is embodied as a p-channel field effect transistor in series with a current source, and wherein the first adjustment signal is a gate-to-source voltage of the p-channel field effect transistor.

18. The active inductor system of claim 14, wherein the train controller is capable of receiving a second feedback signal and, in response to the second feedback signal, varying or maintaining the second adjustment signal to control and adjust the transconductance of the variable gain element.

19. The active inductor system of claim 14, wherein the inductance controller comprises:

a network analyzer adapted to provide a 'dB voltage signal;

a reference voltage generator; and an operational amplifier coupled to the network analyzer and the reference voltage generator, the operational amplifier adapted to provide an inductance control voltage as the first adjustment signal.

20. An active inductor system, active inductor system having a variable frequency response, the active inductor system comprising:

a first p-channel field effect transistor having source, gate and drain, the first p-channel field effect transistor source couplable to a power supply, the first p-channel field effect transistor gate capable of receiving a first adjustment signal;

an inductance controller coupled to the first p-channel field effect transistor gate, the inductance controller capable of providing the first adjustment signal as a gate-to-source voltage of the first p-channel field effect transistor to control and adjust a resistance level of the first p-channel field effect transistor;

a first n-channel field effect transistor having a gate, source and drain, the first n-channel field effect transistor gate coupled to the first p-channel field effect transistor drain, the first n-channel field effect transistor drain couplable to the power supply, the first n-channel field effect transistor source capable of receiving a second adjustment signal; and a gain controller coupled to the first n-channel field effect transistor source, the gain controller capable of providing the second adjustment signal as a current of the first n-channel field effect transistor to control and adjust a transconductance of the first n-channel field effect transistor;

wherein the frequency response is variable in response to adjustment of the resistance level of the first p-channel field effect transistor and in response to adjustment of the transconductance of the first n-channel field effect transistor.

21. The active inductor system of claim 20, wherein the inductance controller is embodied as a second p-channel field effect transistor in series with a current source, and wherein the first adjustment signal is a gate-to-source voltage of the second p-channel field effect transistor.

22. The active inductor system of claim 21, wherein the gain controller is embodied as a second n-channel field effect transistor in series with a first current source, and wherein a gate-to-source voltage of the second n-channel field effect transistor is provided to adjust a current level of a second current source, the second current source coupled to the second n-channel field effect transistor and coupled to the first n-channel field effect transistor, the current level being the second adjustment signal.

23. An active inductor, the active inductor having three terminals, the active inductor having a variable frequency response corresponding to a variable inductance of the active inductor, the active inductor comprising:

a variable resistive element having a first terminal and a second terminal, the second terminal of receiving a first adjustment signal for control of a resistance level of the variable resistive element; and a variable gain element coupled to the variable resistive element, the variable gain element having a third terminal, the third terminal capable of receiving a second adjustment signal for control of a transconductance of the variable gain element, wherein;

the inductance of the active inductor is variable through an adjustment of the transconductance of the variable gain element;

the variable gain element is embodied as an n-channel field effect; and the transconductance of the n-channel field effect transistor is variable through an adjustment of the current of the n-channel field effect transistor.

24. An active inductor, the active inductor having three terminals, the active inductor having a variable frequency response corresponding to a variable inductance of the active, inductor, the active inductor comprising:

a variable resistive element having a first terminal and a second terminal, the second terminal capable of receiving a first adjustment signal for control of a resistance level of the variable resistive element;

a variable gain element coupled to the variable resistive element, the variable gain element having a third terminal, the third terminal capable of receiving a second adjustment signal for control of a transconductance of the variable gain element; and a gain controller coupled to the third terminal of the variable gain element, the gain controller capable of providing the second adjustment signal to control and adjust the transconductance of the variable gain element, wherein the gain controller is capable of receiving a second feedback signal and, in response to the second feedback signal, varying or maintaining the second adjustment signal to control and adjust the transconductance of the variable gain element.

25. An active inductor, the active inductor having three terminals, the active inductor having a variable frequency response corresponding to a variable inductance of the active inductor, the active inductor comprising:

a variable resistive element having a first terminal and a second terminal, the second terminal capable of receiving a first adjustment signal for control of a resistance level of the variable resistive element;

a variable gain element coupled to the variable resistive element, the variable gain element having a third terminal, the third terminal capable of receiving a second adjustment signal for control of a transconductance of the variable train element; and a train controller coupled to the third terminal of the variable gain element, the gain controller capable of providing the second adjustment signal to control and adjust the transconductance of the variable gain element, wherein the train controller is capable of providing the second adjustment signal to maintain a constant transconductance of the variable gain element.

26. An active inductor system, the active inductor system having a variable frequency response, the active inductor system comprising:

a variable resistive element having a first terminal and a second terminal, the second terminal capable of receiving a first adjustment signal;

an inductance controller coupled to the second terminal of die variable resistive element, the inductance controller capable of providing the first adjustment signal to control and adjust a resistance level of the variable resistive element;

a variable gain, element coupled to the variable resistive element, the variable gain element having a third terminal, the third terminal capable of receiving a second adjustment signal; and a gain controller coupled to the third terminal of the variable gain element, the gain controller capable of providing the second adjustment signal to control and adjust a transconductance of the variable gain element, wherein:

the frequency response is variable in response to adjustment of the resistance level of the variable resistive element and in response to adjustment of the transconductance of the variable gain element;

the variable resistive element is embodied as a p-channel field effect transistor; and the resistance level of the p-channel field effect transistor is variable through an adjustment of the gate-to-source voltage of the p-channel field effect transistor.

27. An active inductor system, the active inductor system having a variable frequency response, the active inductor system comprising:

a variable resistive element having a first terminal and a second terminal, the second terminal capable of receiving a first adjustment signal;

an inductance controller coupled to the second terminal of the variable resistive element, the inductance controller capable of providing the first adjustment signal to control and adjust a resistance level of the variable resistive element;

a variable gain element coupled to the variable resistive element, the variable gain element having a third terminal, the third terminal capable of receiving a second adjustment signal; and a gain controller coupled to the third terminal of the variable gain element, the gain controller capable of providing the second adjustment signal to control and adjust a transconductance of the variable gain element, wherein:

the frequency response is variable in response to adjustment of the resistance level of the variable resistive element and in response to adjustment of the transconductance of the variable gain element;

the variable gain element is embodied as an n-channel field effect transistor; and the transconductance of the n-channel field effect transistor is variable through an adjustment of the current of the n-channel field effect transistor.

28. An active inductor system, the active inductor system having a variable frequency response, the active inductor system comprising:

a variable resistive element having a first terminal and a second terminal, the second terminal capable of receiving a first adjustment signal;

an inductance controller coupled to the second terminal of the variable resistive element, the inductance controller capable of providing the first adjustment signal to control and adjust a resistance level of the variable resistive element;

a variable gain element coupled to the variable resistive element, the variable gain element having a third terminal, the third terminal capable of receiving a second adjustment signal; and a gain controller coupled to the third terminal of the variable gain element, the gain controller capable of providing the second adjustment signal to control and adjust a transconductance of the variable gain element, wherein:

the frequency response is variable in response to adjustment of the resistance level of the variable resistive element and in response to adjustment of the transconductance of the variable gain element;

the inductance controller is embodied as a p-channel field effect transistor in series with a current source; and the first adjustment signal is a gate-to-source voltage of the p-channel field effect transistor.

29. An active inductor system, the active inductor system having a variable frequency response, the active inductor system comprising:

a variable resistive element having a first terminal and a second terminal, the second terminal capable of receiving a first adjustment signal;

an inductance controller coupled to the second terminal of the variable resistive element, the inductance controller capable of providing the first adjustment signal to control and adjust a resistance level of the variable resistive element;

a variable gain element coupled to the variable resistive element, the variable gain element having a third terminal, the third terminal capable of receiving a second adjustment signal; and a gain controller coupled to the third terminal of the variable gain element, the gain controller capable of providing the second adjustment signal to control and adjust a transconductance of the variable gain element, wherein:

the frequency response is variable in response to adjustment of the resistance lever of the variable, resistive element and in response to adjustment of he transconductance of the variable gain element; and the gain controller is capable of receiving a second feedback signal and, in response to the second feedback signal, varying or maintaining the second adjustment signal to control and adjust the transconductance of the variable gain element.

30. An active inductor system, the active inductor system having a variable frequency response, the active inductor system comprising:

a variable resistive element having a first terminal and a second terminal, the second terminal capable of receiving a first adjustment signal;

an inductance controller coupled to the second terminal of the variable resistive element, the inductance controller capable of providing the first adjustment signal to control and adjust a resistance level of the variable resistive element, wherein the inductance controller comprises:

a network analyzer adapted to provide a 3 dB voltage signal;

a reference voltage generator; and an operational amplifier coupled to the network analyzer and the reference voltage generator, the operational amplifier adapted to provide an inductance control voltage as the first adjustment signal;

a variable gain coupled to the variable resistive element, the variable gain element having a third terminal, the third terminal capable of receiving a second adjustment signal; and a gain controller coupled to the third terminal of the variable gain element, the gain controller capable of providing the second adjustment signal to control and adjust a transconductance of the variable gain element, wherein:

the frequency response is variable in response to adjustment of the resistance level of the variable resistive element and in response to adjustment of the transconductance of the variable gain element.

* * * * *

UNITED STATES PATENT AND TRADEMARK OFFICE
CERTIFICATE OF CORRECTION

PATENT NO. : 7,199,685 B2
APPLICATION NO. : 10/929843
DATED : April 3, 2007
INVENTOR(S) : Christopher A. Gill It is certified that error appears in the above-identified patent and that said Letters Patent is hereby corrected as shown below:

In column 8, line 43 claim 4, replace "composing" with --comprising--.

In column 10, line 6 claim 19, replace """ with --3--.

In column 11, line 49 claim 21, replace "train" with --gain--.

In column 11, line 64 claim 26, replace "die" with --the--.

In column 13, line 34 claim 29, replace "lever" with --level--.

In column 13, line 35 claim 29, replace "he" with --the--.

Signed and Sealed this

Twenty-second Day of June, 2010

David J. Kappos
*Director of the United States Patent and Trademark Office*